Figure 1:
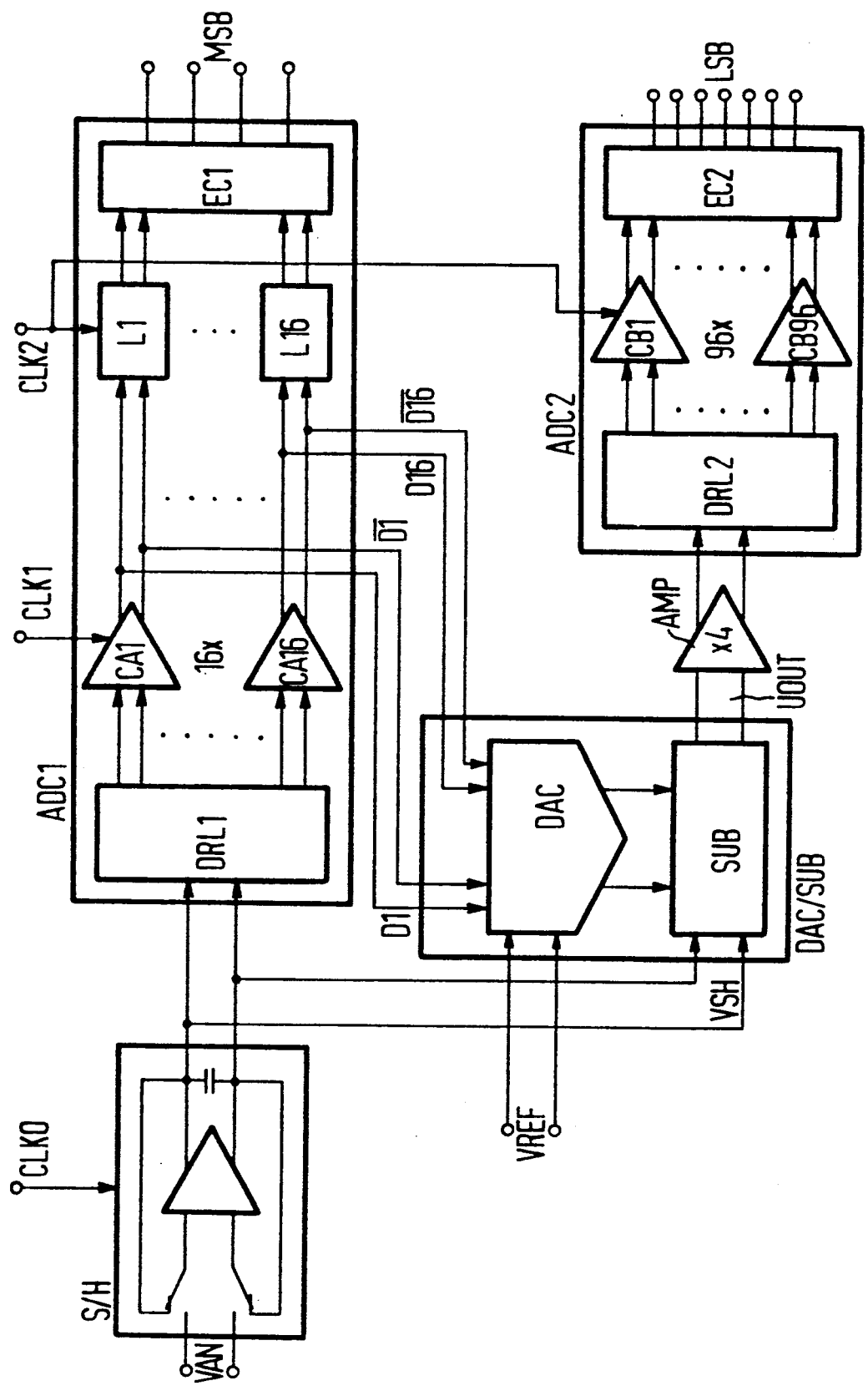

United States Patent [19]

Petschacher et al.

[11] Patent Number: 5,072,220
[45] Date of Patent: Dec. 10, 1991

[54] ANALOG/DIGITAL CONVERTER OPERATING BY THE EXPANDED PARALLEL METHOD

[75] Inventors: Reinhard Petschacher, Villach; Berthold Astegher, Klagenfurt, both of Austria

[73] Assignee: Siemens Aktiengesellschaft, Munich, Fed. Rep. of Germany

[21] Appl. No.: 655,735

[22] Filed: Feb. 14, 1991

[30] Foreign Application Priority Data

Feb. 14, 1990 [DE] Fed. Rep. of Germany ....... 4004545

[51] Int. Cl.$^5$ ............................................. H03M 1/14
[52] U.S. Cl. ................................................... 341/156
[58] Field of Search ............... 341/122, 133, 134, 135, 341/144, 151, 155, 156, 158, 153

[56] References Cited

U.S. PATENT DOCUMENTS

| | | | |
|---|---|---|---|
| 3,597,761 | 8/1971 | Fraschilla et al. | 341/156 |
| 3,721,975 | 3/1973 | Brinkman et al. | 341/156 |
| 4,214,232 | 7/1980 | Shaw et al. | 341/156 |
| 4,663,610 | 5/1987 | Metz et al. | 341/133 |
| 4,684,924 | 8/1987 | Wood | 341/156 |
| 4,774,497 | 9/1988 | Taylor | 341/133 X |
| 4,862,171 | 8/1989 | Evans | 341/156 |
| 4,875,048 | 10/1989 | Shimizu et al. | 341/156 |

*Primary Examiner*—Howard L. Williams
*Attorney, Agent, or Firm*—Herbert L. Lerner; Laurence A. Greenberg

[57] ABSTRACT

An analog/digital converter assembly includes a first analog/digital converter having N-bit resolution, operating by the parallel method and having comparators. A sample and hold element is connected upstream of the first analog/digital converter. A second analog/digital converter has M-bit resolution, operates by the parallel method and has comparators. A digital/analog converter is connected upstream of the second analog/digital converter. A subtractor is connected to the digital/analog converter and to the sample and hold element. An amplifier is connected downstream of the subtractor. Output signals of the comparators of the first analog/digital converter is provided directly with a $1^x$ out of $2^N$ code for triggering the digital/analog converter. The same reference voltage is applied to both the first analog/digital converter and the digital/analog converter.

8 Claims, 2 Drawing Sheets

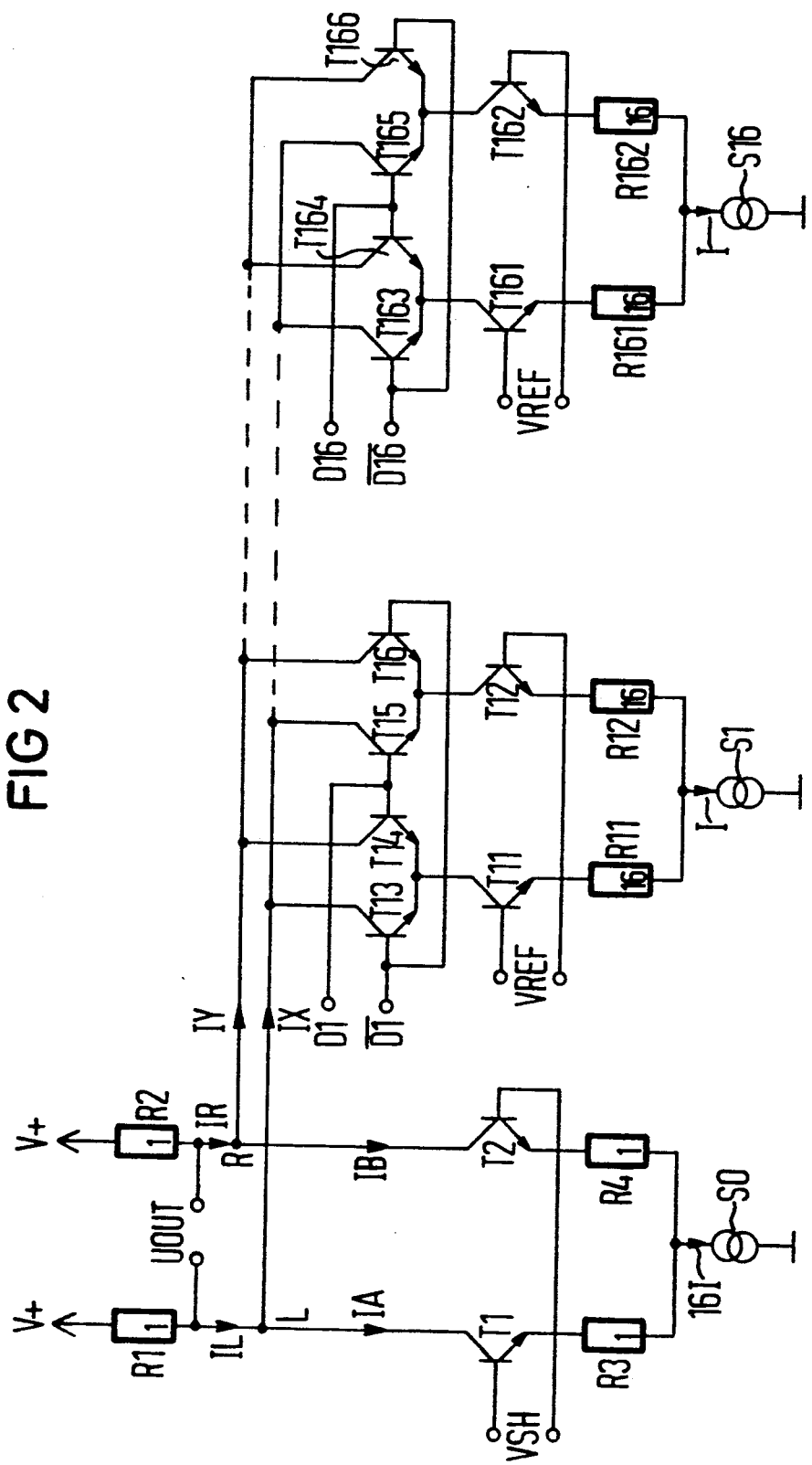

ANALOG/DIGITAL CONVERTER OPERATING BY THE EXPANDED PARALLEL METHOD

The invention relates to an analog/digital converter including a first analog/digital converter having N-bit resolution, operating by the parallel method and having comparators, a sample and hold element connected upstream of the first analog/digital converter, a second analog/digital converter having M-bit resolution, operating by the parallel method and having comparators, a digital/analog converter connected upstream of the second analog/digital converter, a subtractor connected to the digital/analog converter and to the sample and hold element, and an amplifier connected downstream of the subtractor.

When manufacturing analog/digital converters, short conversion times on one hand and high resolution on the other hand, are two demands that are difficult to satisfy together Converters with high resolution, such as those operating by the counting method or the weighing method, usually have relatively long conversion times, while converters with very short conversion times, such as those operating by the parallel method, are limited in the attainable resolution by the fact that the necessary expense for circuitry increases approximately exponentially with the output word length. For instance, 1023 comparators are needed for a 10 bit converter. That expense can be reduced considerably by making sacrifices in terms of conversion speed. To this end, the parallel method may be combined with the weighing method.

For instance, a 10 bit converter using the expanded parallel method is achieved by converting the upper 5 bits in parallel, in a first step. The outcome represents the roughly quantified value of the input voltage. With a digital/analog converter, the associated analog voltage is formed and subtracted from the input voltage. The remainder left over is digitized with a higher resolution than the first, by using an analog/digital converter.

Rough and fine values must naturally each be formed by the same input voltage. However, there is a time lag due to the transit time through the first analog/digital converter and the digital/analog converter. The input voltage in that method must therefore be kept constant with an analog sample and hold element, until the whole number is formed. The principle of an analog/digital converter operating by the expanded parallel method is described, for instance, in the publication entitled Halbleiterschaltungstenchnik [Semiconductor Circuitry] by U. Tietze and Ch. Schenk, 7th Edition 1985, pp. 765–767.

The demands of the analog/digital converters are less with that circuitry principle, but the digital/analog converter must have the full accuracy, or in other words the full 10-bit accuracy, in such a case. In order to achieve the necessary accuracy, some form of calibration is therefore necessary. Yet it is precisely in integrated circuits, and in particular in monolithically integrated circuits, that calibration in whatever form is problematic and usually entails considerable additional effort and expense.

It is accordingly an object of the invention to provide an analog/digital converter operating by the expanded parallel method, which overcomes the hereinaforementioned disadvantages of the heretofore-known devices of this general type and which does not require any calibration.

With the foregoing and other objects in view there is provided, in accordance with the invention, an analog/digital converter assembly, comprising a first analog/digital converter having N-bit resolution, operating by the parallel method and having comparators; a sample and hold element connected upstream of the first analog/digital converter; a second analog/digital converter having M-bit resolution, operating by the parallel method and having comparators; a digital/analog converter connected upstream of the second analog/digital converter; a subtractor connected to the digital/analog converter and to the sample and hold element; an amplifier connected downstream of the subtractor; means for providing output signals of the comparators of the first analog/digital converter directly by means of a $1^x$ out of $2^N$ code for triggering the digital/analog converter; and means for applying the same reference voltage to both the first analog/digital converter and the digital/analog converter.

In accordance with another feature of the invention, there are provided means for processing signals symmetrically in at least one of the sample and hold element, the first and second analog/digital converters, the digital/analog converter, the subtractor, and with the reference voltage being symmetrical.

In accordance with a further feature of the invention, the sample and hold element supplies a symmetrical output signal, and the digital/analog converter and the subtractor are combined and include a first differential amplifier stage having differential inputs receiving the symmetrical output signal of the sample and hold element and having an output line, a number of second differential amplifier stages corresponding to the number of the comparators of the first analog/digital converter and having output lines, crosswise-coupled third and fourth differential amplifier stages being connected in the output lines of the second differential amplifier stages and being respectively triggered by the comparators, and common load resistors connected to the output lines of the first and second differential amplifier stages, the second differential amplifier stages having identical supply currents, and the first differential amplifier stage having a supply current being equal to the sum of the supply currents of the second differential amplifier stages.

In accordance with an added feature of the invention, the first differential amplifier stage includes a number of parallel-connected further differential amplifiers being equal in number to the number of stages of the digital/analog converter.

In accordance with an additional feature of the invention, the first and second differential amplifiers have negative feedback resistors.

In accordance with yet another feature of the invention, there is provided a cascode stage or stages connected in the output line or lines of the first differential amplifier stage or stages and connected to a further reference potential.

In accordance with a concomitant feature of the invention, the third and fourth differential amplifier stages have base sides connected through one of the second differential amplifier stages to the further reference potential.

The advantage of an analog/digital converter according to the invention is that the expense for circuitry is not substantially increased, despite the elimination of calibration provisions.

Other features which are considered as characteristic for the invention are set forth in the appended claims.

Although the invention is illustrated and described herein as embodied in an analog/digital converter operating by the expanded parallel method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic and block circuit diagram of a basic embodiment of an analog/digital converter according to the invention; and FIG. 2 is a schematic circuit diagram of a preferred embodiment of a subtractor and a digital/analog converter, in an analog/digital converter according to the invention.

Referring now to the figures of the drawings in detail and first, particularly, to FIG. 1 thereof, there is seen an analog/digital converter according to the invention having a sample and hold element S/H, a first analog/digital converter ADC1, a second analog/digital converter ADC2 operating by the parallel method, a subtracting digital/analog converter DAC/SUB, and an amplifier AMP. Controlled by a clock signal CLK0, an analog symmetrical input signal VAN is stored in memory with the sample and hold element S/H. Outputs in the form of an inverting output and a non-inverting output of the sample and hold element S/H are connected to the corresponding inputs of the first analog/digital converter ADC1 and of the subtracting digital/analog converter DAC/SUB. Due to the symmetry, both these inputs and the inputs of the sample and hold element S/H are differential inputs. The analog/digital converter ADC1 includes a first symmetrical resistor network DRL1 which is followed by differential inputs of sixteen first comparators CA1 ... CA16 controlled by a clock signal CLK1.

Each of the first comparators CA1 ... CA16 is followed by a memory element L1 ... L16 controlled by a clock signal CLK2. The outputs of the memory elements L1 ... L16 are carried to a priority decoder EC1. The inputs of the memory elements L1 ... L16 and of the priority decoder EC1, like the outputs of the memory elements L1 ... L16, are constructed as respective differential inputs and outputs. The differential outputs of the first comparators CA1 ... CA16 are also connected to the differential inputs of a digital/analog converter DAC. The digital/analog converter DAC, together with a subtractor SUB following it, form the subtracting digital/analog converter DAC/SUB. A symmetrical reference voltage VREF is connected to both the digital/analog converter DAC and the symmetrical resistor network DRL1. The subtractor SUB is acted upon not only by the output signals of the digital/analog converter DAC but also by the output signals of the sample and hold element S/H. The subtractor SUB is followed by the amplifier AMP having a gain of 4, which likewise has differential inputs and differential outputs. The amplifier AMP is followed by a second symmetrical resistor network DRL2, to which the symmetrical reference voltage VREF is also applied. The differential outputs of the symmetrical resistor network DRL2 are connected to second comparators CB1 ... CB96, which are controlled by the clock signal CLK2. The differential outputs of the comparators CB1 ... CB96 are carried to a second priority decoder EC2. The symmetrical resistor network DRL2, the second comparators C1 ... CB96 and the second priority decoder EC2 form the second analog/digital converter ADC2. The most significant and least significant bits MSB and LSM of the conversion outcome are applied to the asymmetrical outputs of the two priority decoders EC1, EC2.

FIG. 2 of the drawing shows a preferred embodiment of the subtracting digital/analog converter DAC/SUB. A differential amplifier stage, which is provided as the subtractor SUB, has two npn transistors T1, T2 with collectors connected through respective resistors R1 and R2 to a positive supply potential V+, and emitters each being connected through a respective resistor R3 and R4 to current impressing means S0 leading to a ground potential. The bases of the two transistors T1 and T2 form the differential inputs of the subtractor SUB, to which the symmetrical output signal VSH of the sample and hold element S/H is applied, as shown in FIG. 1 of the drawing. The digital/analog converter DAC, like the analog/digital converter ADC1, is a 4 bit converter. However, it is not triggered by a 4 bit binary code but rather with an x out of $2^N$ code, in which N is equivalent to the number of bits of the associated binary code. In the present exemplary embodiment, the digital/analog converter DAC is accordingly triggered with sixteen symmetrical input signals D1 ... D16, DI ... DI6, which can be picked up directly at the outputs of the comparators CA1 ... CA16 of the analog/digital converter ADC1, as FIG. 1 of the drawing shows.

The digital/analog converter DAC includes sixteen identically structured differential amplifier stages. Each of these stages has current impressing means S1 ... S16, which are connected to ground potential and each of which are connected through a respective transistor R11 ... R161 and R12 ... R162 to a respective npn transistor T11 ... T161 and T12 ... T162. The bases of these two transistors T11 ... T161 and T12 ... T162 form the differential inputs to which the symmetrical reference voltage VREF is applied, as is also shown in FIG. 1. The collectors of the transistors T11 ... T161 are carried to the coupled emitters of two npn transistors T13 ... T163 and T14 ... T164 that form a first pair of transistors. Likewise, the collectors of the transistors T12 ... T162 are carried to the coupled emitters of two npn transistors T15 ... T165 and T16 ... T166 that form a second pair of transistors. The bases of one transistor per pair in each pair of transistors are coupled together and acted upon by a respective input signal D1 ... D16. The bases of the other two transistors are likewise coupled together and acted upon by a respective inverted input signal DI ... DI6. The collectors of the transistors of the first pair of transistors are also coupled crosswise with the corresponding transistors of the second pair of transistors. For the present exemplary embodiment, this means that the bases of the transistors T13 ... T163 are connected to the bases of the transistors T16 ... T166, and the inverted input signal DI ... DI6 is applied to both bases. Consequently, the bases of the transistors T14 ... T164 and the transistors T15 ... T165 are connected together and acted upon by the input signal D1 ... D16. Finally, the collectors of the transistors T13 ...

T163 and T15 ... T165 are connected to one another and to the collector of the transistor T1, forming a node or node point L, and the transistors T14 ... T164 and T16 ... T166 are likewise joined on the collector side and connected to the collector of the transistor T2, forming a node or node point R. A current IL flows into the node L and a current IR flows into the node R from the positive supply potential V+. A current IA flows to the transistor T1 and a current IX flows to the digital-/analog converter from the node L, while, a current IB flows to the transistor T2 and a current IY flows to the digital/analog converter from the node R.

Due to their identical structure, the current impressing means S1 ... S16 furnish the same constant current I. The current impressing means S0 is dimensioned in such a way that it furnishes $2^N$ times the current, or in other words, in this case, 16 times the current I. The resistors R1-R4 are identical to one another, the resistors R11, R12 ... R161, R162 are also identical to one another, and the resistors of the latter group each have 16 times the resistance of the resistors R1-R4. In this connection it should also be pointed out that as an alternative to the illustrated embodiment, the subtractor SUB may also be constructed in such a way that $2^N = 16$ identical subtractor stages are connected in parallel, with their resistors and their current impressing means having the same values as the resistors and current impressing means of the digital/analog converter DAC.

The subtraction procedure between the analog signal and the fed-back signal in an amplifier circuit used as the subtractor SUB is achieved by adding two currents IA, IX and IB, IY at a time. An output current IL or IR of the amplifier circuit rises in proportion with the input voltage VSH, while the current IX or IY of the digital-/analog converter drops with increasing input voltage VSH. The outcome of the subtraction is represented by the currents IL and IR flowing across the resistors R1 and R2. A direct component is superimposed on both currents. However, if the circuit is symmetrically laid out, as is shown according to a further feature of the invention in the exemplary embodiment, this direct component is substantially insignificant, so that a symmetrical output signal UOUT present between the nodes L and R represents the outcome of the subtraction. In order for this to happen, it is essential for the slope of the current IA or IB to exactly match the mean slope of the output current IL or IR, so that the direct component of the output currents IL and IR is independent of the input voltage VSH and does not distort the curvature of the conversion characteristic curve. In order to attain this, some arbitrary form of calibration is typically provided.

However, in order to make do without calibration provisions in this case, the same reference voltage VREF is used for the digital/analog converter DAC that is also used in quantification by the analog/digital converter ADC1. Since the digital/analog converter shown in the present exemplary embodiment is a 4 bit converter, it includes sixteen identical stages, which are supplied with the current I through the current impressing means S1 ... S16. With the aid of the symmetrical reference voltage VREF, this current I is split into two partial currents, which can then be sent from the input signals D1, DI ... D16, DI6 to either the output node L or the output node R. Through the use of the differential amplifier having the transistors T1 and T2, the resistors R1-R4 and the current impressing means S0 having a current of 16I, the two currents IA and IB proportional to the symmetrical input voltage VSH are obtained therefrom. In applications in which only an odd number of digital signals is provided, a symmetrification stage is also added. This stage is constructed identically to the other stages of the digital/analog converter DAC. The two differential inputs of this stage are connected to one another and applied to a potential that is somewhere between the highest and lowest level of the digital input signal. Thus, if the digital/analog converter DAC were acted upon by only 15 input signals, for instance, then the inputs for the digital signals D16 or DI6 would be applied to an asymmetrical potential which, for instance, is equal to the mean value of the minimum and maximum level of the other input signals G1, GI ... G15, GI5. The possibility also exists of placing a cascode stage, including two transistors, between the nodes L and R and the collectors of the respective transistors T1 and T2. The base of the cascode stage would also be connected with this asymmetrical potential. However, in the exemplary embodiment shown, the triggering of the symmetrification stage is effected by an additional comparator, namely the comparator CA16 of the analog/digital converter ADC1. For a 4 bit converter, for example with the analog/digital converter ADC1, in principle only 15 comparators would be necessary. The additional comparator responds to the direct voltage superimposed on the symmetrical resistor network DRL1.

Another reason why calibration provisions are unnecessary is that the digital/analog converter DAC is not triggered by the output signals present in the binary code which would, for example, require a binary graduation in the digital/analog converter DAC, but rather by the output signals of the individual comparators of the analog/digital converter ADC1. As a result, no binary graduations are necessary, but instead only identically structured stages. It is substantially easier to make an exactly identical structure, and the process is therefore subject to substantially fewer fluctuations. Furthermore, the structure of the various stages of the digital/analog converter DAC can also be adapted to the various comparators of the analog/digital converter ADC.

We claim:

1. An analog/digital converter assembly, comprising a first differential analog/digital converter having N-bit resolution, operating by the parallel method and having comparators; a differential sample and hold element connected upstream of said first analog/digital converter; a second differential analog/digital converter having M-bit resolution, operating by the parallel method and having comparators; a differential digital-/analog converter connected upstream of said second analog/digital converter a differential subtractor connected to said digital/analog converter and to said sample and hold element; an amplifier connected downstream of said subtractor; means for providing output signals of said comparators of said first analog/digital converter directly by means of a $1^x$ out of $2^N$ code for triggering said digital/analog converter; means for applying the same differential reference voltage to both said first analog/digital converter and said digital-/analog converter, and means for processing signals differentially in at least one of said sample and hold element, said first and second analog/digital converters, said digital/analog converter, and said subtractor.

2. The analog/digital converter assembly according to claim 1, wherein said sample and hold element supplies a differential output signal, and said digital/analog converter and said subtractor are matched and include:

a first differential amplifier stage having differential inputs receiving the differential output signal of said sample and hold element and having an output line, a number of second differential amplifier stages corresponding to the number of said comparators of said first analog/digital converter and having output lines, crosswise-coupled third and fourth differential amplifier stages being connected in the output lines of said second differential amplifier stages and being respectively triggered by said comparators, and common load resistors connected to the output lines of said first and second differential amplifier stages, said second differential amplifier stages having identical supply currents, and said first differential amplifier stage having a supply current being equal to the sum of the supply currents of said second differential amplifier stages.

3. The analog/digital converter assembly according to claim 2, wherein said first differential amplifier stage includes a number of parallel-connected further differential amplifiers being equal in number to the number of stages of said digital/analog converter.

4. The analog/digital converter assembly according to claim 1, wherein said first and second differential amplifiers have negative feedback resistors.

5. The analog/digital converter assembly according to claim 2, including a cascode stage connected in the output line of said first differential amplifier stage and connected to a further reference potential.

6. The analog/digital converter assembly according to claim 5, wherein said third and fourth differential amplifier stages have base sides connected through one of said second differential amplifier stages to the further reference potential.

7. The analog/digital converter assembly according to claim 2, including at least one other first differential amplifier stage having an output line, and cascode stages connected in the output lines of said first differential amplifier stages and connected to a further reference potential.

8. The analog/digital converter assembly according to claim 7, wherein said third and fourth differential amplifier stages have base sides connected through one of said second differential amplifier stages to the further reference potential.

* * * * *